(12) United States Patent
Osaga et al.

(10) Patent No.: US 9,716,052 B2
(45) Date of Patent: Jul. 25, 2017

(54) SEMICONDUCTOR DEVICE COMPRISING A CONDUCTIVE FILM JOINING A DIODE AND SWITCHING ELEMENT

(71) Applicant: Mitsubishi Electric Corporation, Tokyo (JP)

(72) Inventors: Tsuyoshi Osaga, Tokyo (JP); Mikio Ishihara, Tokyo (JP); Kazuaki Hiyama, Tokyo (JP); Tatsuya Kawase, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/894,456

(22) PCT Filed: Aug. 28, 2013

(86) PCT No.: PCT/JP2013/072960
§ 371 (c)(1),
(2) Date: Nov. 27, 2015

(87) PCT Pub. No.: WO2015/029159
PCT Pub. Date: Mar. 5, 2015

(65) Prior Publication Data
US 2016/0126156 A1    May 5, 2016

(51) Int. Cl.
*H01L 23/34* (2006.01)
*H01L 29/861* (2006.01)
(Continued)

(52) U.S. Cl.
CPC .......... *H01L 23/34* (2013.01); *H01L 23/5386* (2013.01); *H01L 24/02* (2013.01);
(Continued)

(58) Field of Classification Search
CPC ....................................................... H01L 23/34
See application file for complete search history.

(56) References Cited

U.S. PATENT DOCUMENTS 4,709,255 A * 11/1987 Hartgring ........... H01L 29/7881
                                                          257/321
5,869,878 A *  2/1999 Hasegawa ................ G01K 7/01
                                                          257/341
(Continued)

FOREIGN PATENT DOCUMENTS

JP         07-153920 A    5/1995
JP        H08-213441 A    8/1996
(Continued)

OTHER PUBLICATIONS

International Search Report issued in Application No. PCT/JP2013/072960, mailed Dec. 10, 2013.
(Continued)

*Primary Examiner* — Scott B Geyer
*Assistant Examiner* — S. M. S Imitiaz
(74) *Attorney, Agent, or Firm* — Studebaker & Brackett PC (57) ABSTRACT

A ground working tool comprising a tubular base body with an inner receiving space for receiving a cylindrical core of solid ground material, connector mechanism for connecting the tubular base body with a rotary drive and locking mechanism for locking the core in the receiving space of the tubular base body. The locking mechanism involves at least one locking unit having a guide rail being disposed at an inner side of the tubular base body and arranged with a deviation angle relative to a tangential direction of the tubular base body and the locking unit further comprises at least one locking element, which is moveably mounted on the guide rail between a radially outer releasing position and a radially inner locking position, in which the core is clamped within the receiving space by means of the at least one locking element.

6 Claims, 7 Drawing Sheets

(51) Int. Cl.
  *H01L 27/06*  (2006.01)
  *H01L 29/423*  (2006.01)
  *H01L 29/739*  (2006.01)
  *H01L 29/78*  (2006.01)
  *H01L 23/538*  (2006.01)
  *H01L 23/495*  (2006.01)
  *H01L 23/00*  (2006.01)

(52) U.S. Cl.
  CPC ............. *H01L 24/06* (2013.01); *H01L 24/49* (2013.01); *H01L 27/0629* (2013.01); *H01L 27/0664* (2013.01); *H01L 29/4236* (2013.01); *H01L 29/42372* (2013.01); *H01L 29/7397* (2013.01); *H01L 29/7811* (2013.01); *H01L 29/7813* (2013.01); *H01L 29/861* (2013.01); *H01L 23/49562* (2013.01); *H01L 24/05* (2013.01); *H01L 24/29* (2013.01); *H01L 24/33* (2013.01); *H01L 24/45* (2013.01); *H01L 24/48* (2013.01); *H01L 2224/0237* (2013.01); *H01L 2224/04042* (2013.01); *H01L 2224/05548* (2013.01); *H01L 2224/0603* (2013.01); *H01L 2224/291* (2013.01); *H01L 2224/33181* (2013.01); *H01L 2224/45124* (2013.01); *H01L 2224/48091* (2013.01); *H01L 2224/48247* (2013.01); *H01L 2224/49113* (2013.01); *H01L 2924/13055* (2013.01); *H01L 2924/13091* (2013.01)

(56) References Cited

U.S. PATENT DOCUMENTS

| | | | |
|---|---|---|---|
| 7,045,831 B2 | 5/2006 | Narazaki | |
| 7,470,958 B2* | 12/2008 | Hirose | H01L 27/0255 257/173 |
| 2003/0178644 A1* | 9/2003 | Lee | H01L 24/03 257/200 |
| 2005/0151254 A1 | 7/2005 | Narazaki | |
| 2008/0142799 A1 | 6/2008 | Kaneko | |
| 2010/0193935 A1* | 8/2010 | Lachner | H01Q 1/2283 257/693 |
| 2011/0233544 A1* | 9/2011 | Honda | H01L 29/0615 257/48 |
| 2014/0133104 A1* | 5/2014 | Delgado | H01L 23/3735 361/715 |
| 2014/0183744 A1* | 7/2014 | Lee | H01L 21/563 257/762 |
| 2015/0137353 A1* | 5/2015 | Wirz | H01L 23/481 257/737 |
| 2015/0140782 A1* | 5/2015 | Stuber | H01L 21/84 438/458 |
| 2015/0243639 A1* | 8/2015 | How | H01L 24/92 257/676 |
| 2015/0340305 A1* | 11/2015 | Lo | H01L 23/49531 257/666 |

FOREIGN PATENT DOCUMENTS

| | | | |
|---|---|---|---|
| JP | H10-116987 A | | 5/1998 |
| JP | 2003-209131 A | | 7/2003 |
| JP | 2003-229460 A | | 8/2003 |
| JP | 2005-203474 A | | 7/2005 |
| JP | 2007-059882 A | | 3/2007 |
| JP | 2007-287919 A | * | 11/2007 |
| JP | 2008-130983 A | | 6/2008 |
| JP | 2010-103571 A | | 5/2010 |
| JP | 2011-096699 A | | 5/2011 |
| JP | 2013-055214 A | | 3/2013 |
| WO | 2015/025422 A1 | | 2/2015 |

OTHER PUBLICATIONS

Notification Concerning Transmittal of International Preliminary Report on Patentability and Translation of Written Opinion of the International Searching Authority; PCT/JP2013/072960 issued on Mar. 10, 2016.

An Office Action "Notice of Reasons for Refusal" issued by the Japanese Patent Office on Jun. 14, 2016, which corresponds to Japanese Patent Application No. 2015-533844 and is related to U.S. Appl. No. 14/894,456; with partial English language translation.

An Office Action issued by the Japanese Patent Office on Jan. 31, 2017, which corresponds to Japanese Patent Application No. 2015-533844 and is related to U.S. Appl. No. 14/894,456; with English language translation; 9pp.

An Office Action; "Decision of Refusal" issued by the Japanese Patent Office on Apr. 4, 2017, which corresponds to Japanese Patent Application No. 2015-533844 and is related to U.S. Appl. No. 14/894,456; with partial English language translation.

* cited by examiner

SEMICONDUCTOR DEVICE COMPRISING A CONDUCTIVE FILM JOINING A DIODE AND SWITCHING ELEMENT

TECHNICAL FIELD

The present invention relates to a semiconductor device in which a switching element and a temperature sensing diode that measures the operation temperature of the switching element are located on a chip.

BACKGROUND ART

Power modules including power chips (semiconductor devices) mounted thereon, such as insulated gate bipolar transistors (IGBTs) and metal oxide semiconductor field effect transistors (MOSFETs), are used as switching devices that perform the switching operation of energizing and interrupting a current speedily.

The continuous switching operation causes the power loss being the integral of the product of the current flowing through the switching device and the voltage applied to the switching device, resulting in the heat generation in the power chip. If the temperature of the power chip exceeds the guaranteed range of operation, the power chip would malfunction.

To prevent the temperature of the power chip from exceeding the guaranteed range of operation, the power chip including a temperature sensing diode that monitors the surface temperature of the power chip has been used (see, for example, Patent Documents 1 to 3).

PRIOR ART DOCUMENTS

Patent Documents

Patent Document 1: Japanese Patent Application Laid-Open No. 2007-287919
Patent Document 2: Japanese Patent Application Laid-Open No. 08-213441 (1996)
Patent Document 3: Japanese Patent Application Laid-Open No. 10-116987 (1998)

SUMMARY OF INVENTION

Problem to be Solved by the Invention

The forward voltage VF of the diode decreases with increasing temperature. Therefore, the temperature of the power chip can be detected by converting the value of the forward voltage VF of the temperature sensing diode into a temperature.

The processing of converting the forward voltage VF of the temperature sensing diode into a temperature has been performed by the control circuit provided in the power module separately from the power chip and connected to the power chip. To establish a connection between the power chip and the control circuit, the cathode electrode (terminal) of the temperature sensing diode in the power chip and the main electrode of the switching element (such as, the emitter electrode in a case where the switching element is the IGBT) in the power chip have been connected to each other within the control circuit or through the relay terminals. That is, the cathode electrode pad for the temperature sensing diode and the main electrode pad for the switching element have been separately provided in the power chip. Each of these electrode pads needs to be wired to the relay terminal located outside the power chip such that these electrode pads are short-circuited. This has deteriorated the assembly performance.

The present invention has been made to solve the problem described above and has an object to provide a semiconductor device capable of achieving improved assembly performance and downsizing.

Means to Solve the Problem

To solve the above-mentioned problem, the semiconductor device according to the present invention includes: a switching element formed in a semiconductor substrate; a temperature sensing diode formed in the semiconductor substrate; a main current electrode pad for the switching element, the main current electrode pad being provided on the semiconductor substrate; and a conductive film that is provided above the semiconductor substrate and electrically connects one electrode of the temperature sensing diode and a main current electrode.

Effects of the Invention

According to the present invention, the semiconductor device includes: the switching element formed in the semiconductor substrate; the temperature sensing diode formed in the semiconductor substrate; the main current electrode pad for the switching element, the main current electrode pad being provided on the semiconductor substrate; and the conductive film that is provided above the semiconductor substrate and electrically connects the one electrode of the temperature sensing diode and the main current electrode pad. Thus, the present invention can achieve improved assembly performance and downsizing.

These and other objects, features, aspects and advantages of the present invention will become more apparent from the following detailed description of the present invention when taken in conjunction with the accompanying drawings.

DESCRIPTION OF EMBODIMENTS

The following describes embodiments of the present invention with reference to the drawings.

In the embodiments, the description is given assuming that the switching element formed on the substrate (semiconductor substrate) of the semiconductor device is an IGBT.

Underlying Technique

Firstly, the following describes the technique (underlying technique) underlying the present invention.

Figure 7:
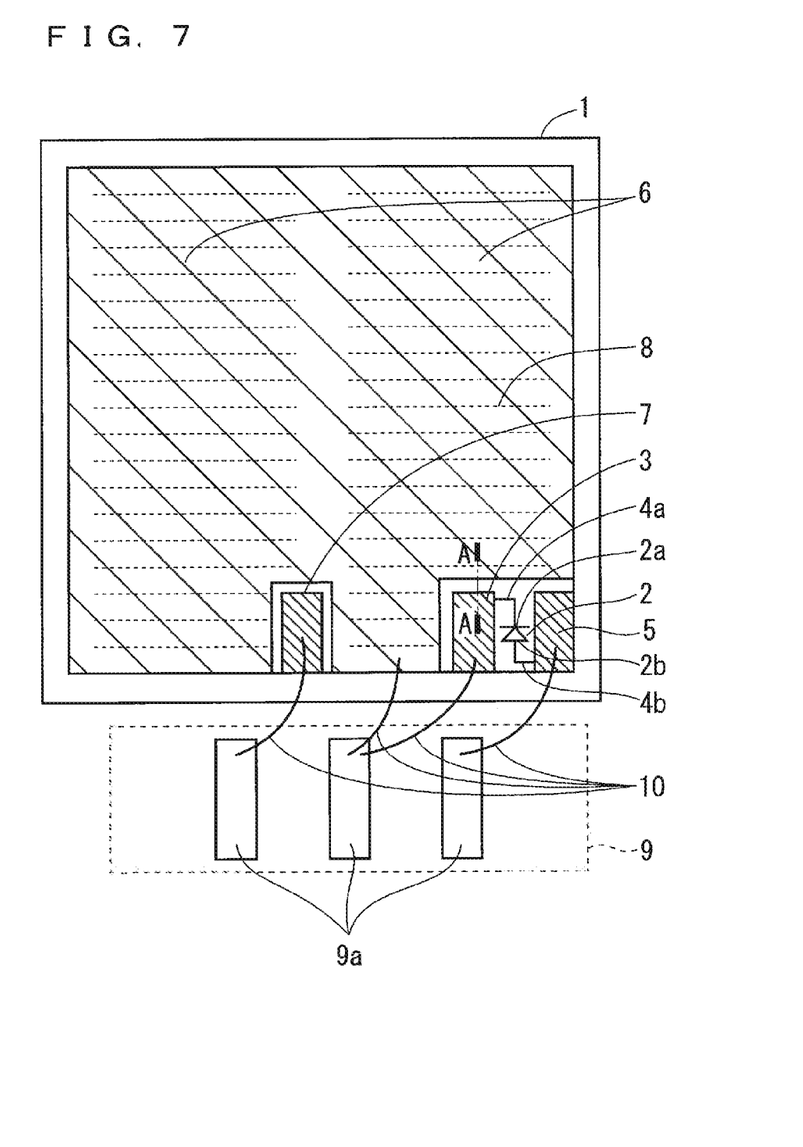
FIG. 7 is a plan view illustrating a configuration example of a semiconductor device according to an underlying technique.

FIG. 7 is a plan view illustrating a configuration example of a semiconductor device 1 (a power chip) according to the underlying technique.

In the semiconductor device 1, an emitter electrode pad 6 (a main current electrode pad) and a gate electrode pad 7 are provided on a substrate and trenches 8 are provided in the substrate, whereby an IGBT (a switching element) is formed. In the semiconductor device 1, a temperature sensing diode 2 is formed above the substrate.

A cathode electrode 2a of the temperature sensing diode 2 is connected with a cathode electrode pad 3 via a cathode trace 4a. An anode electrode 2b of the temperature sensing diode 2 is connected with an anode electrode pad 5 via an anode trace 4b.

The cathode electrode pad 3, the anode electrode pad 5, and the gate electrode pad 7 are each connected to relay terminals 9a via relay terminal connection traces 10. The relay terminal 9a is one of the constituent components of a terminal portion 9 provided in the power module including the semiconductor device 1 and the control circuit (not shown). The relay terminal connection traces 10 may be, for example, aluminum wires or may be wires made of another metal.

Although not shown in the drawings, traces drawn from the control circuit are also connected with the relay terminals 9a as needed.

Figure 8:
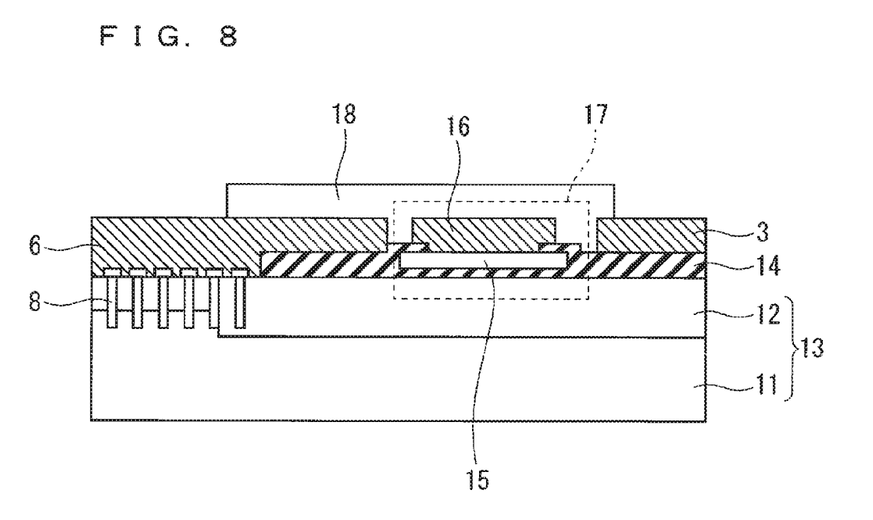
FIG. 8 is a cross-sectional view illustrating the configuration example of the semiconductor device according to the underlying technique.

FIG. 8 is a cross-sectional view illustrating an example of the cross section taken along line A-A in FIG. 7. For easy understanding of the description, FIG. 8 illustrates, in a simplified manner, only the main constituent components necessary for the description.

The cathode electrode pad 3 and the emitter electrode pad 6 are formed above an Si substrate 13 (a semiconductor substrate) with an insulating film 14 located therebetween. The Si substrate 13 consists of an N$^-$ layer 11 and a P layer 12.

The trenches 8 for forming the gate electrodes of the individual cells of the IGBT are formed in the Si substrate 13 below the emitter electrode pad 6. The pitch between the individual trenches 8 in FIG. 7 does not correspond with the pitch between the individual trenches 8 in FIG. 8.

Doped polysilicon 15 and a gate metal trace 16 are formed as a lamination, which is disposed separately between the cathode electrode pad 3 and the emitter electrode pad 6. The doped polysilicon 15 and the gate metal trace 16 are consist of a gate trace portion 17. The gate trace portion 17 is connected with the gate electrode pad 7.

A protective film 18 is formed so as to cover the insulating film 14, the gate metal trace 16, a part of the cathode electrode pad 3, and a part of the emitter electrode pad 6.

Although not shown in the cross-sectional view in FIG. 8, the temperature sensing diode 2 is also formed above the Si substrate 13.

In the semiconductor device 1 according to the underlying technique, the cathode electrode pad 3 and the emitter electrode pad 6 are insulated from each other (are not in electrical connection) as mentioned above. However, the cathode electrode pad 3 and the emitter electrode pad 6 are short-circuited for use in some cases. In these cases, the cathode electrode pad 3 and the emitter electrode pad 6 need to be short-circuited in the following manner. The relay terminal connection traces 10 are drawn from the cathode electrode pad 3 and the emitter electrode pad 6, and then, the relay terminal connection traces 10 drawn from the individual electrode pads are connected to each other in the relay terminals 9a. This has deteriorated the assembly performance of the semiconductor device 1.

The present invention therefore has been made to solve the problem mentioned above and will be described below in detail.

First Embodiment

Figure 1:
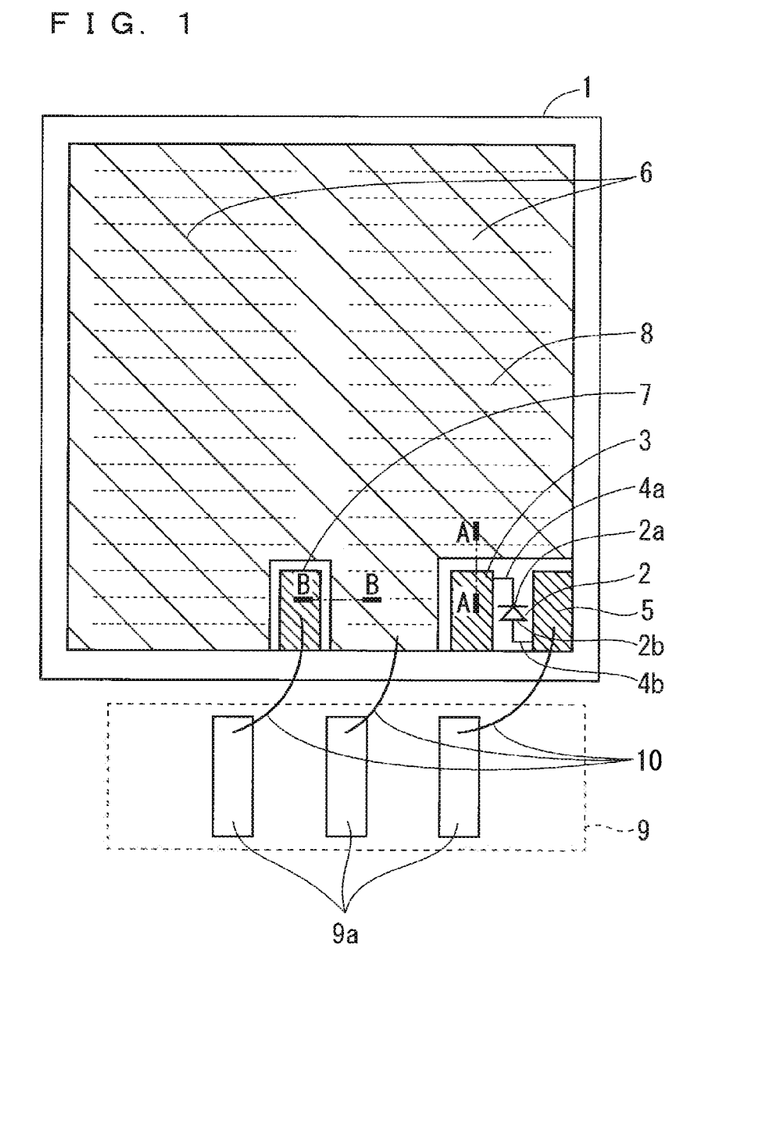
FIG. 1 is a plan view illustrating a configuration example of a semiconductor device according to a first embodiment of the present invention.
Figure 2:
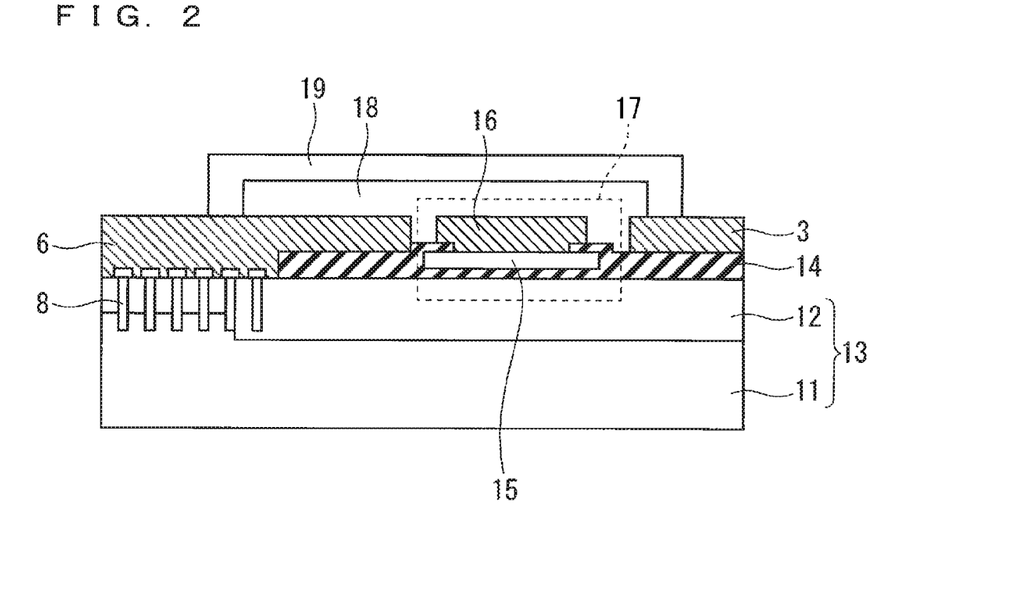
FIG. 2 is a cross-sectional view illustrating the configuration example of the semiconductor device according to the first embodiment of the present invention.

FIG. 1 is a plan view illustrating a configuration example of the semiconductor device 1 according to a first embodiment of the present invention. FIG. 2 is a cross-sectional view illustrating an example of the cross section taken along line A-A in FIG. 1.

As illustrated in FIG. 2, the semiconductor device 1 according to the first embodiment features a cathode-emitter connection trace 19 (a conductive film) that has electrical conductivity and electrically connects the cathode electrode pad 3 and the emitter electrode pad 6. The configuration except for the above is similar to that of the semiconductor device 1 according to the underlying technique illustrated in FIG. 7 and a description thereof is omitted.

The cathode-emitter connection trace 19 is provided so as to cover the protective film 18 such that the cathode electrode pad 3 and the emitter electrode pad 6 are connected (short-circuited). Thus, the cathode-emitter connection trace 19 is provided above the Si substrate 13 and establishes an electrical connection between the cathode electrode pad 3 (one electrode pad) connected with the cathode electrode 2a (one electrode) of the temperature sensing diode 2 and the emitter electrode pad 6 (the main current electrode pad).

The cathode-emitter connection trace 19 may be made of, for example, an aluminum film or may be made of another conductive metal film.

The cathode electrode pad 3 and the emitter electrode pad 6 are at the same potential because the cathode-emitter connection trace 19 is provided. Thus, as illustrated in FIG. 1, the relay terminal connection traces 10 that connect the cathode electrode pad 3 and the relay terminals 9a can be eliminated.

Figure 3:
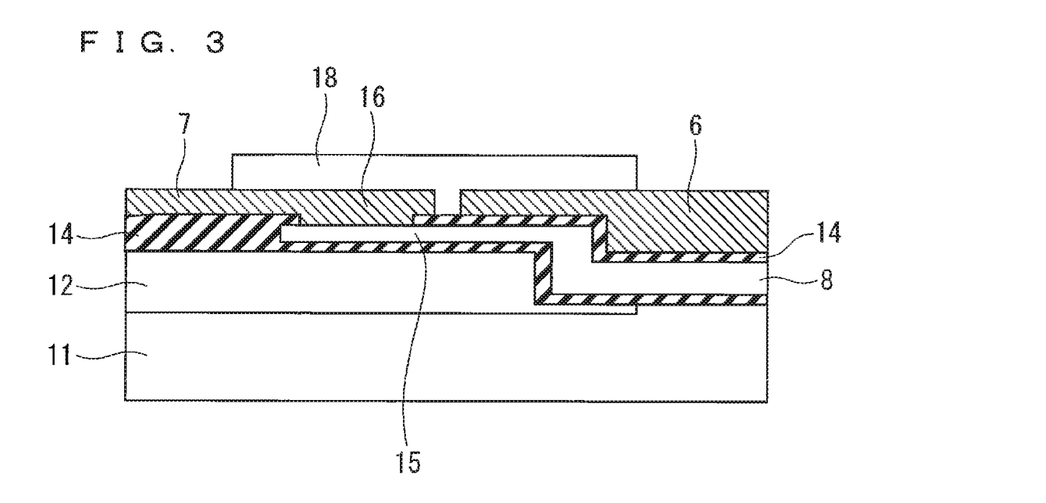
FIG. 3 is a cross-sectional view illustrating the configuration example of the semiconductor device according to the first embodiment of the present invention.

FIG. 3 is a cross-sectional view illustrating an example of the cross section taken along line B-B in FIG. 1.

As illustrated in FIG. 3, the gate electrode pad 7 is directly connected with the gate metal trace 16.

The trenches 8 are filled with the doped polysilicon 15. The doped polysilicon 15 is connected with the gate metal trace 16 (and thus, the trench gate is formed).

Thus, in the first embodiment, the cathode electrode pad 3 and the emitter electrode pad 6 can be short-circuited within the semiconductor device 1. The relay terminal connection traces 10 that connect the cathode electrode pad 3 and the relay terminals 9a are accordingly eliminated, thereby achieving the improved assembly performance and the downsizing of the semiconductor device 1.

In a case where the both surfaces of the Si substrate 13 are ready for soldering (soldering can be performed onto the front surface and the back surface of the Si substrate 13) and a metal film (a front metal (FM)) capable of being soldered is formed on the emitter electrode pad 6, the metal film may be formed as the cathode-emitter connection trace 19. Thus, the metal film (FM) and the cathode-emitter connection trace 19 are formed at the same time (in the same process). This allows for the formation of the cathode-emitter connection trace 19 with no additional process.

Second Embodiment

Figure 4:
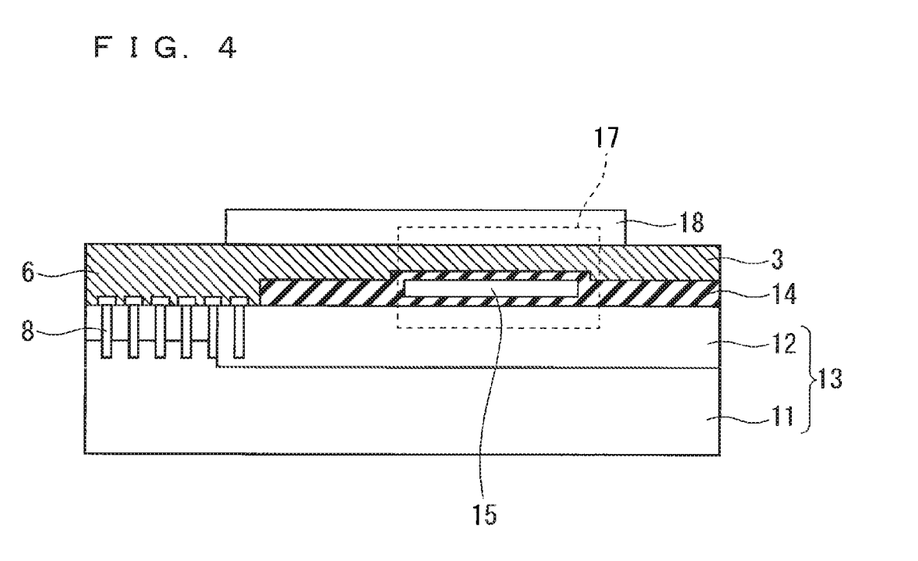
FIG. 4 is a cross-sectional view illustrating a configuration example of a semiconductor device according to a second embodiment of the present invention.

FIG. 4 is a cross-sectional view illustrating a configuration example of the semiconductor device 1 according to a second embodiment of the present invention. FIG. 4 illustrates an example of the cross section taken along line A-A in FIG. 1.

As illustrated in FIG. 4, the semiconductor device 1 according to the second embodiment features the cathode electrode pad 3 and the emitter electrode pad 6 formed to be connected to each other in the same layer and the gate metal trace 16 (a control electrode trace) are divided in the gate trace portion 17 in which the cathode electrode pad 3 and the emitter electrode pad 6 cross the gate trace portion 17. Thus, the doped polysilicon 15 is formed in a continuous manner in the portion in which the gate metal trace 16 is divided. In this configuration, the conductive film and the gate metal trace 16 can be formed in the same process. The conductive film electrically connects the cathode electrode pad 3 and the emitter electrode pad 6. The configuration except for the above is similar to that of the first embodiment (see FIGS. 1 to 3), and a description thereof is omitted.

Thus, in the second embodiment, the effects of the first embodiment are produced, and furthermore, the conductive film that electrically connects the cathode electrode pad 3 and the emitter electrode pad 6 is formed in the same process, whereby the cathode electrode pad 3 and the emitter electrode pad 6 can be short-circuited with no additional manufacturing process.

Figure 5:
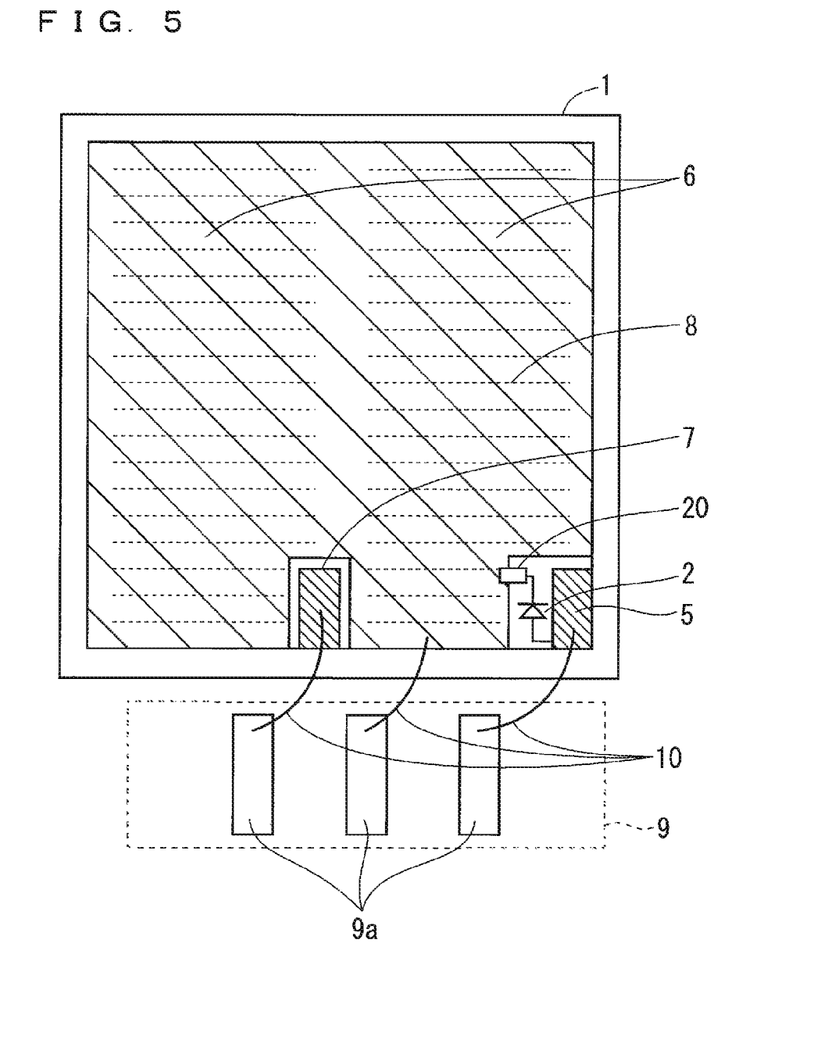
FIG. 5 is a plan view illustrating another configuration example of the semiconductor device according to the second embodiment of the present invention.

With reference to FIG. 5, a cathode-emitter connecting portion 20 having the configuration illustrated in FIG. 4 may be provided, so that the cathode trace 4a is directly connected with the cathode electrode pad 3 and the emitter electrode pad 6. Thus, the conductive film that electrically connects the cathode electrode pad 3 and the emitter electrode pad 6 electrically connects the cathode electrode 2a of the temperature sensing diode 2 and the emitter electrode pad 6 not via the cathode electrode pad 3 for the temperature sensing diode 2 illustrated in FIG. 1. The cathode-emitter connecting portion 20 refers to the portion in which the cathode trace 4a and the emitter electrode pad 6 are connected. This configuration can eliminate the cathode electrode pad 3, thus increasing the effective area in the semiconductor device 1.

Figure 6:
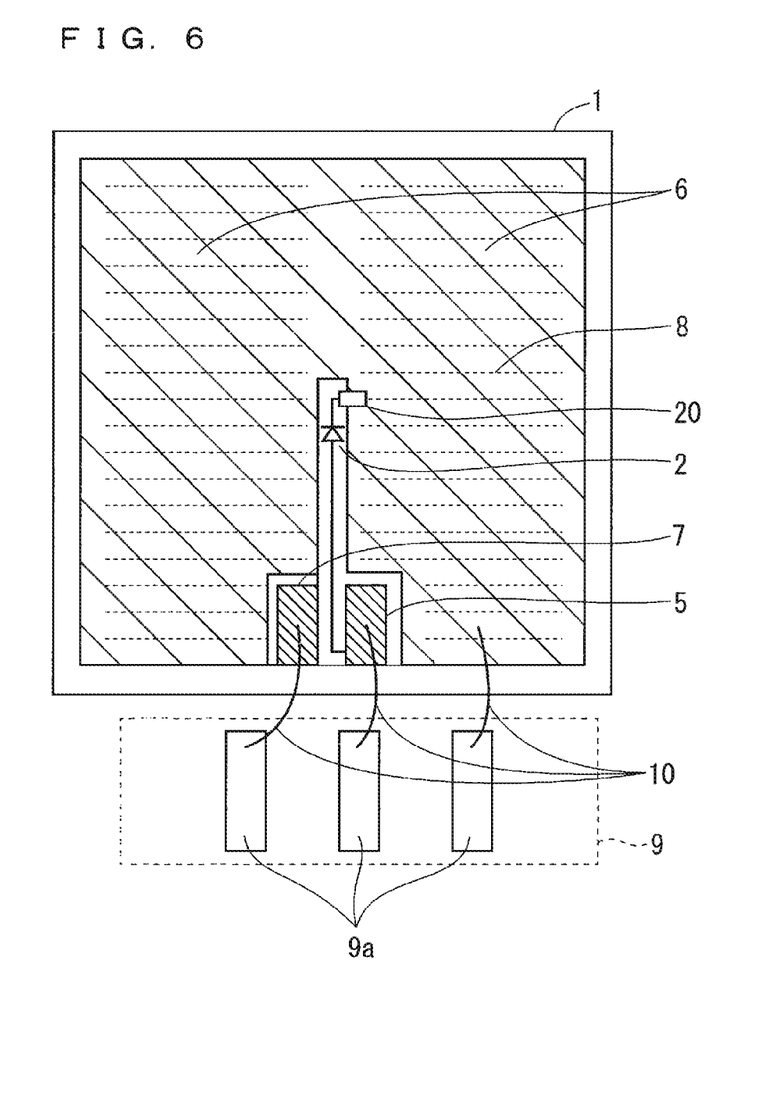
FIG. 6 is a plan view illustrating still another configuration example of the semiconductor device according to the second embodiment of the present invention.

The configuration in FIG. 5 provided as described below can produce the effects similar to the above. As illustrated in FIG. 6, the anode electrode pad 5 (the other electrode pad) for the temperature sensing diode 2 is provided above the peripheral portion of the semiconductor substrate and the temperature sensing diode 2 is formed above the central part of the semiconductor substrate. Optionally, the position of the anode electrode pad 5 may be changed. This increases the degree of design flexibility.

In the present invention, each embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE 1 semiconductor device, 2 temperature sensing diode, 2a cathode electrode, 2b anode electrode, 3 cathode electrode pad, 4a cathode trace, 4b anode trace, 5 anode electrode pad, 6 emitter electrode pad, 7 gate electrode pad, 8 trench, 9 terminal portion, 9a relay terminal, 10 relay terminal connection trace, 11 $N^-$ layer, 12 P layer, 13 Si substrate, 14 insulating film, 15 doped polysilicon, 16 gate metal trace, 17 gate trace portion, 18 protective film, 19 cathode-emitter connection trace, 20 cathode-emitter connecting portion.

The invention claimed is:

1. A semiconductor device comprising:
a switching element formed in a semiconductor substrate;
a temperature sensing diode formed in said semiconductor substrate;
a main current electrode pad for said switching element, said main current electrode pad being provided on said semiconductor substrate; and
a conductive film that is provided above said semiconductor substrate and electrically connects one electrode of said temperature sensing diode and said main current electrode pad;
wherein
said conductive film is formed in the same layer as, and directly electrically connects said one electrode of said temperature sensing diode and said main current electrode pad without an electrode pad for said one electrode of said temperature sensing diode.

2. The semiconductor device according to claim 1, further comprising a control electrode trace for said switching element, said control electrode trace being provided above said semiconductor substrate,
wherein said conductive film and said control electrode trace are formed in the same process.

3. The semiconductor device according to claim 2, further comprising another electrode pad for said temperature sensing diode, said another electrode pad being provided above a peripheral portion of said semiconductor substrate,
wherein said temperature sensing diode is formed above a central portion of said semiconductor substrate.

4. The semiconductor device according to claim 1, further comprising a metal film located on said main current electrode pad, said metal film joined through soldering,
wherein said conductive film and said metal film are formed in the same process.

5. A semiconductor device comprising:
a switching element formed in a semiconductor substrate;
a temperature sensing diode formed in said semiconductor substrate;
a main current electrode pad for said switching element, said main current electrode pad being provided on said semiconductor substrate;
a conductive film that is provided above said semiconductor substrate in the same layer as, and directly electrically connecting one electrode of said temperature sensing diode and said main current electrode pad without an electrode pad for said one electrode of said temperature sensing diode; and
a control electrode trace for said switch element, said control electrode trace being provided above said semiconductor substrate,
wherein said conductive film is formed over said control electrode trace and isolated from said control electrode trace by an insulating film.

6. A semiconductor device comprising:
a switching element formed in a semiconductor substrate;
a temperature sensing diode formed in said semiconductor substrate;

a main current electrode pad for said switching element, said main current electrode pad being provided on said semiconductor substrate; and a conductive film that is provided above said semiconductor substrate in the same layer as, and directly electrically connecting one electrode of said temperature sensing diode and said main current electrode pad without an electrode pad for said one electrode of said temperature sensing diode; and a metal film located on said main current electrode pad, said metal film joined through soldering, wherein said conductive film and said metal film are formed in the same process.

\* \* \* \* \*